July 7, 1959 K. LEHOVEC 2,893,901

SEMICONDUCTOR JUNCTION

Filed Jan. 28, 1957

INVENTOR.
KURT LEHOVEC

BY Connolly & Hutz

HIS ATTORNEYS

United States Patent Office 2,893,901

Patented July 7, 1959

2,893,901

SEMICONDUCTOR JUNCTION

Kurt Lehovec, Williamstown, Mass., assignor to Sprague Electric Company, North Adams, Mass., a corporation of Massachusetts Application January 28, 1957, Serial No. 636,821

1 Claim. (Cl. 148—1.5)

Figure 1:
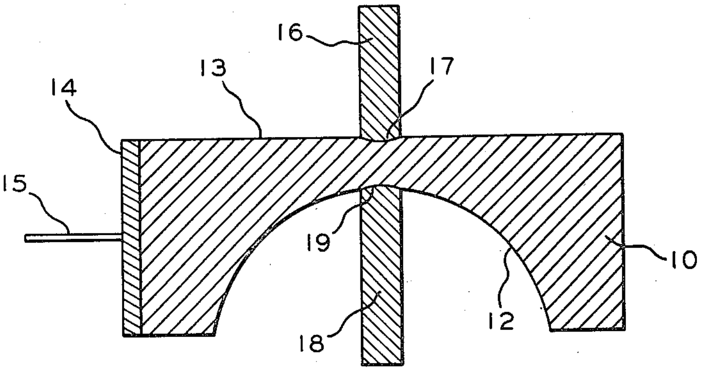

This invention relates to semiconductor devices, and more particularly to surface alloying processes together with apparatus for producing alloy junctions and the junctions formed by the processes and apparatus. This application is a continuation-in-part of Serial No. 516,180, filed June 17, 1955, now U.S. Letters Patent 2,779,877, issued January 29, 1957.

The more common forms of junction transistors utilize a semiconductor with three regions of conductivity, e.g. an N-region sandwiched between two P-regions (PNP) or one P-region sandwiched between two N-regions (NPN). A typical example of such a transistor is the germanium PNP alloy junction transistor which is produced by fusing indium on opposite surfaces of an N-type germanium wafer; the molten indium dissolves some germanium of the wafer, which is recrystallized as a P-type germanium layer after solidification of the indium-germanium alloy. It should be understood that although this invention will be explained in terms of an indium germanium PNP alloy junction transistor, the scope of the invention is not limited to a PNP junction structure or to germanium as the semiconducting body. The invention applies as well to an NPN or other multiple junction device, and to other semiconducting materials such as silicon and the groups III–V intermetallic compounds.

One of the more important properties of the PNP indium germanium alloy junction transistor is its frequency response, which depends largely on the width of the N-type germanium region between the two P-type regions. In order to extend the frequency response to higher frequencies, said width should be made as small as possible, a few tenths of a mil being a typical dimension.

In order to control the electrical properties of these alloy junction devices, the penetration of the rectifying electrode into the N-type germanium body must not be greater than a fraction of a mil, and the diameter of the electrode must be no wider than a few mils. Prior art methods of producing alloy junction devices of this type have included plating gallium or indium on the N-type germanium; and in another case, fusing a small wafer of indium saturated with germanium onto the N-type germanium. The methods suffer difficulties in attaching electrode contact lead wires to the plating or to the wafer.

It is an object of this invention to provide a method for producing alloy junctions having very small width electrodes and contact wires. A further object of this invention is the provision of an economical method for producing alloy junction transistors which avoids handling tiny metal pellets commonly used for the alloying process. A still further object of this invention is to provide a method of attaching electrode contacts by alloying to a layer which is quite thin.

The objects of this invention are achieved by effusing a liquid metal, or metal alloy, from a suitable orifice onto a surface of the semiconductor to provide an electrode and/or a contact lead wire.

More particularly the objects of this invention are achieved by melting the electrode material, for example an indium germanium alloy; depositing the molten material in the capillary of a tube, e.g., glass or carbon, which has suitable heating means to maintain the alloy in a molten state; and then by means of pressure, forcing the alloy into contact with the semiconductor surface. The alloy solidifies immediately at the surface. By controlled withdrawal of the tube, and with continued pressure, a filament can be drawn from the electrode.

Still more particularly, the objects of this invention are achieved by alloying the semiconductor with a liquid metal (or metal alloy) which effuses from a small orifice of a container of said liquid metal. By maintaining proper temperatures of the semiconductor and of the liquid metal leaving the orifice of the container, only a thin layer of the semiconductor will be dissolved by the metal when the metal and the semiconductor are brought in contact. There are essentially two ways in which this can be achieved. In one case a droplet of metal is removed from the orifice and is brought into contact with the semiconductor. Only a thin layer of semiconductor will be dissolved in the metal if the volume of the metal is quite small and if the temperature of the metal is kept low enough so that a small amount of the semiconductor already dissolved, saturates the metal. In the other method, the metal is still in contact with the bulk metal in the container when brought into contact with the semiconducor surface, and is solidified so rapidly that only a small amount of the semiconductor metal has time to dissolve.

Figure 2:
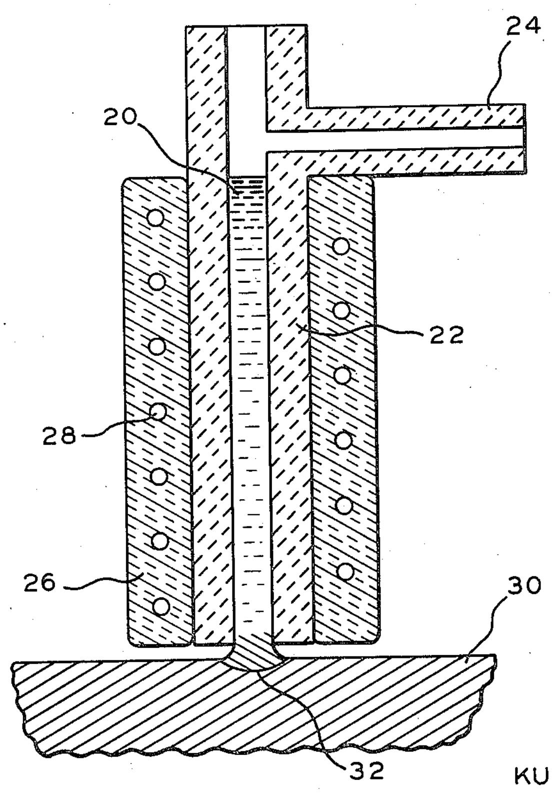

The invention and the above noted and other features will be understood more clearly and fully from the following detailed description with reference to the accompanying drawing, in which:

Fig. 1 is a cross-sectional view of a semiconductor body, having opposed micro-alloy junctions with electrodes produced according to this invention, and a conventional base electrode; and, Fig. 2 is a cross-sectional view of an apparatus for practicing the process of this invention.

Referring to Fig. 1 of the drawing, the semiconductor 10 has one planar surface 13 and an opposed surface having a depression 12. Conventional etching techniques, e.g. jet etching, may be employed to produce depression 12 and to produce the desired interelectrode thickness. Semiconductor 10 is provided with a base or gate electrode 14 of a non-rectifying nature. Electrode 14 may be composed of solder, and may be provided with a contact wire 15. Micro-alloy junctions 17 and 19 are provided in opposed faces 13 and 12, respectively, and have contact leads 16 and 18 extending therefrom. Solely by way of example, semi-conductor 10 is of N-type germanium and the micro-junctions are obtained in accordance with this invention by fusing an indium-germanium alloy to the body 10.

The electrode contacts 16 and 18 and junctions 17 and 19 can be applied in the manner shown in Fig. 2. A quantity of molten electrode material 20 is held in a capillary tube 22 of carbon, glass or quartz, for example. An internal tube diameter of about 5 mils or less is particularly suitable. The molten electrode material, which can be an indium-germanium alloy, is readily drawn up in such a capillary as by applying suction through a conveniently connected side tube 24 near the upper end of the capillary. While the composition of the alloy may have indium-germanium ratios of from about 2:1 to about 40:1, parts by weight, optimum properties are obtained with a composition of 20 parts indium to 1 part germanium. The germanium is added to the melt to prevent the indium from dissolving too much germanium in the crystal. The amount of germanium which can be added to the alloy is limited in that germanium raises the melting point and decreases the ductility. The top of the capillary can be covered by a plug, not shown, or can be sealed shut if desired. In order to keep the electrode material from solidifying in the capillary, it can be surrounded by a jacket of insulation 26 and in addition an electric heating coil 28, either of the resistive or inductive type, can be provided to generate heat.

The capillary containing the molten electrode material is used by placing its lower end against or within about 10 mils of the surface of the body 30 to which the electrode is to be applied. Pressure then applied as by way of the side tube 24 will cause the lower end of the molten column of electrode material to be forced out and into contact with the surface of the body 10. By keeping the body 10 at a relatively low temperature, as for example 100 to 500° C. below the freezing point of the molten electrode material, the contacting end will solidify and be firmly affixed to the surface of the body 10, with limited diffusion of the impurity so that a rectifying junction is formed immediately below the crystal surface. Although wider differences in temperature can be used, the best adhesion, which closely approximates a welded joint, will be formed when a small temperature difference is present. The amount of germanium in the alloy governs the melting point of the alloy, which in turn controls the time needed to solidify the junctions 17 and 19 in the germanium body 10. In this way the depth of the junctions may be easily computed in terms of melting point of the alloy 20 and time of contact between the alloy and body 10. It has been determined that contact of 10 to 20 seconds gives reproducible penetration of a germanium body, and hence, control over the interelectrode spacing. In other words, since the amount of penetration of the junction by my process may be readily reproduced, the spacing between the electrodes may be readily controlled by varying the depth of the etching of depression 12 in body 10. After the end of the molten stem has solidified, the capillary can be slowly withdrawn from the solidified joint, with or without the continued application of pressure to the side tube 24, and the molten electrode material will be pulled out, gradually solidifying against the adhered end to provide an elongated filament.

By using the above technique, an electrode contact having a contact area two mils wide or even less, is readily provided on bodies of germanium, silicon or even on the surface of other materials such as indium wafers or the like. The contacted surface of body 10 can have a melting point above or below that of the electrode material 20. Variations in controlling the depth of the junction may be obtained by heating and cooling semiconductor 10 during and/or after contact with the molten alloy 20.

Since the time during which the liquid alloy is kept in contact with the germanium is quite short, it is frequently desirable to assure good and uniform wetting of the germanium. In an embodiment of this invention wetting is achieved by plating the surface of the germanium with a metal film, e.g., indium, which dissolves in the liquid metal alloy. Thus, it should be understood that the process and apparatus of my invention may also be employed to provide contact leads to junctions formed by any of the conventional prior art methods.

As many apparently widely different embodiments of this invention may be made without departing from the spirit and scope thereof, it is to be understood that the invention is not limited to the specific embodiments hereof except as defined in the appended claim.

What is claimed is:

A process for producing an alloy junction in a semiconductor body comprising providing a reservoir of a molten metal or metal alloy capable of changing the conductivity of a semiconductor body to the opposite type when brought into solid solution in the semiconductor body, forcing a small amount of the molten metal or metal alloy from the reservoir through a restricted column and contacting a portion of the semiconductor body with said small amount of the molten metal or metal alloy, dissolving the contacted portion of the semiconductor body in said small amount of the metal or metal alloy, recrystallizing the liquid phase consisting of said small amount of the molten metal or metal alloy and said dissolved portion of the semiconductor body, whereby a pn-junction is produced.

References Cited in the file of this patent

UNITED STATES PATENTS

| | | |
|---|---|---|
| 2,736,847 | Barnes | Feb. 28, 1956 |
| 2,757,324 | Pearson | July 31, 1956 |
| 2,765,245 | English et al. | Oct. 2, 1956 |
| 2,791,524 | Ozarow | May 7, 1957 |

FOREIGN PATENTS

| | | |
|---|---|---|
| 1,088,286 | France | Sept. 8, 1954 |